(12) United States Patent
Sato et al.

(10) Patent No.: US 10,080,292 B2
(45) Date of Patent: Sep. 18, 2018

(54) WIRING BOARD

(71) Applicant: SHINKO ELECTRIC INDUSTRIES CO., LTD., Nagano (JP)

(72) Inventors: Junji Sato, Nagano (JP); Hitoshi Kondo, Nagano (JP); Katsuya Fukase, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 15/635,590

(22) Filed: Jun. 28, 2017

(65) Prior Publication Data

US 2018/0014407 A1 Jan. 11, 2018

(30) Foreign Application Priority Data

Jul. 8, 2016 (JP) .................................. 2016-136291

(51) Int. Cl.
*H01L 23/31* (2006.01)
*H05K 1/18* (2006.01)
(Continued)

(52) U.S. Cl.
CPC ........... *H05K 1/186* (2013.01); *H01L 21/486* (2013.01); *H01L 21/4853* (2013.01); *H01L 21/4857* (2013.01); *H01L 21/6835* (2013.01); *H01L 23/3157* (2013.01); *H01L 23/5383* (2013.01); *H01L 23/5386* (2013.01);
(Continued)

(58) Field of Classification Search
CPC ............. H01L 21/4853; H01L 21/4857; H01L 21/486; H01L 21/6835; H01L 23/3157; H01L 23/5383; H01L 23/5386; H01L 23/5389; H01L 25/0657; H01L 24/16; H01L 2221/68345; H01L 2224/16227; H01L 2224/16237; H01L 2225/06541; H01L 2225/06548; H01L 2225/06586; H01L 2924/1434; H01L 2924/19041; H01L 2924/19102; H01L 2924/386; H05K 1/186; H05K 1/111; H05K 1/115; H05K 3/4007; H05K 3/424; H05K 3/4682; H05K 2201/10015; H05K 2201/10515; H05K 2201/10636; H05K 2201/10734;
(Continued)

(56) References Cited

U.S. PATENT DOCUMENTS

| 8,797,757 B2 | 8/2014 | Kaneko et al. |
| 2009/0205202 A1* | 8/2009 | Tanaka .................... H01L 24/82 29/834 |
| 2016/0095215 A1* | 3/2016 | Furutani .................. H05K 1/09 174/251 |

FOREIGN PATENT DOCUMENTS

| JP | 2012-146793 | 8/2012 |
| JP | 2013-084692 | 5/2013 |

\* cited by examiner

*Primary Examiner* — Michael P McFadden
(74) *Attorney, Agent, or Firm* — IPUSA, PLLC

(57) ABSTRACT

A wiring board includes an electronic component; an insulating layer containing the electronic component therein, and including a via hole that is open at one surface of the insulating layer to expose an electrode of the electronic component; a first wiring layer embedded in the insulating layer, one surface of the first wiring layer being exposed at the one surface of the insulating layer; a second wiring layer including a wiring pattern formed on the one surface of the first wiring layer, and a via wiring extended from the wiring pattern to be extended in the via hole and directly connected to an electrode of the electronic component.

6 Claims, 16 Drawing Sheets

(51) Int. Cl.
*H01L 21/48* (2006.01)
*H05K 3/46* (2006.01)
*H01L 21/683* (2006.01)
*H01L 23/538* (2006.01)
*H01L 25/065* (2006.01)
*H05K 1/11* (2006.01)
*H05K 3/40* (2006.01)
*H05K 3/42* (2006.01)
*H01L 23/00* (2006.01)

(52) U.S. Cl.
CPC ...... *H01L 23/5389* (2013.01); *H01L 25/0657* (2013.01); *H05K 1/111* (2013.01); *H05K 1/115* (2013.01); *H05K 3/4007* (2013.01); *H05K 3/424* (2013.01); *H05K 3/4682* (2013.01); *H01L 24/16* (2013.01); *H01L 2221/68345* (2013.01); *H01L 2224/16227* (2013.01); *H01L 2224/16237* (2013.01); *H01L 2225/06541* (2013.01); *H01L 2225/06548* (2013.01); *H01L 2225/06586* (2013.01); *H01L 2924/1434* (2013.01); *H01L 2924/19041* (2013.01); *H01L 2924/19102* (2013.01); *H01L 2924/386* (2013.01); *H05K 2201/10015* (2013.01); *H05K 2201/10515* (2013.01); *H05K 2201/10636* (2013.01); *H05K 2201/10734* (2013.01); *H05K 2201/10977* (2013.01)

(58) Field of Classification Search
CPC ........ H05K 2201/10977; G06F 1/1641; G06F 1/1652; G06F 1/1616; G06F 1/1618
USPC ......... 361/760–761, 767–769; 174/260, 267, 174/255; 257/673, 700, 701
See application file for complete search history.

WIRING BOARD

CROSS-REFERENCE TO RELATED APPLICATIONS

The present application is based on and claims the benefit of priority of Japanese Priority Application No. 2016-136291 filed on Jul. 8, 2016, the entire contents of which are hereby incorporated by reference.

FIELD

The present invention relates to a wiring board.

BACKGROUND

Conventionally, a wiring board is known that contains inside an electronic component such as a capacitor or an inductor. As an example of such a wiring board, a wiring board including a glass epoxy substrate, which is a core, that contains inside a stacked structure of ceramic capacitors may be raised. In this wiring board, wirings are formed at front and back surfaces of the glass epoxy substrate, and the wiring at the both surfaces and electrodes of the stacked ceramic capacitors are connected through via wirings formed in the glass epoxy substrate (see Patent Document 1, for example).

Meanwhile, a wiring board is known in which embedded wirings are provided at one side of an insulating layer (see Patent Document 2, for example). When containing an electronic component inside such a wiring board, it is impossible to adopt a connection structure similar to the above described wiring board for connecting the embedded wirings with electrodes of the electronic component. Thus, as a method of connecting the embedded wirings with the electrodes of the electronic component, for example, a method of using a conductive paste may be considered.

However, there is a problem that sufficient connection reliability cannot be obtained by the method of connecting the embedded wirings with the electrodes of the electronic component using the conductive paste.

Patent Document 1: Japanese Laid-open Patent Publication No. 2013-84692

Patent Document 2: Japanese Laid-open Patent Publication No. 2012-146793

SUMMARY

The present invention is made in light of the above problems, and provides a wiring board in which connection reliability between an embedded wiring and an electrode of an electronic component is improved.

According to an embodiment, there is provided a wiring board including an electronic component; an insulating layer containing the electronic component therein, and including a via hole that is open at one surface of the insulating layer to expose an electrode of the electronic component; a first wiring layer embedded in the insulating layer, one surface of the first wiring layer being exposed at the one surface of the insulating layer; a second wiring layer including a wiring pattern formed on the one surface of the first wiring layer, and a via wiring extended from the wiring pattern to be extended in the via hole and directly connected to an electrode of the electronic component.

BRIEF DESCRIPTION OF DRAWINGS

Other objects, features and advantages of the present invention will become more apparent from the following detailed description when read in conjunction with the accompanying drawings.

DESCRIPTION OF EMBODIMENTS

Figure 1A:
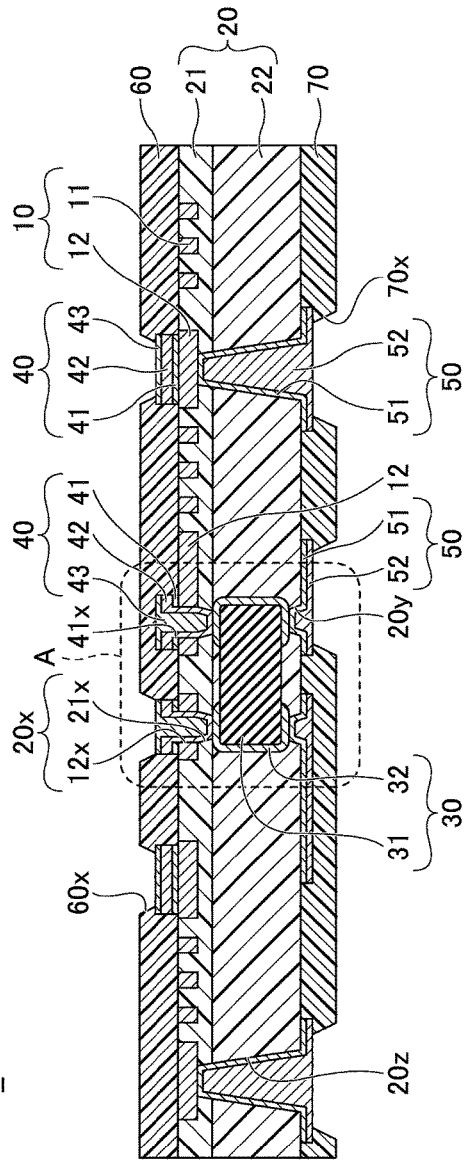
FIG. 1A and FIG. 1B are views illustrating an example of a wiring board of a first embodiment.

The invention will be described herein with reference to illustrative embodiments. Those skilled in the art will recognize that many alternative embodiments can be accomplished using the teachings of the present invention and that the invention is not limited to the embodiments illustrated for explanatory purposes.

It is to be noted that, in the explanation of the drawings, the same components are given the same reference numerals, and explanations may not be repeated.

First Embodiment (Structure of Wiring Board of First Embodiment)

Figure 1B:
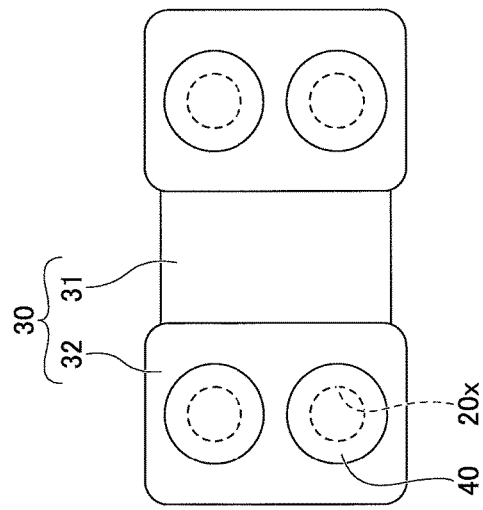

First, a structure of a wiring board of a first embodiment is described. FIG. 1A and FIG. 1B are views illustrating an example of a wiring board 1 of the first embodiment. FIG. 1A is a cross-sectional view, and FIG. 1B is an enlarged plan view of a portion "A" in FIG. 1A.

With reference to FIG. 1A and FIG. 1B, the wiring board 1 is a coreless wiring board including a first wiring layer 10, an insulating layer 20, an electronic component 30, a second wiring layer 40, a third wiring layer 50 and solder resist layers 60 and 70. However, the first wiring layer 10, the insulating layer 20 and the solder resist layer 60 are not illustrated in FIG. 1B.

In this embodiment, a solder resist layer 60 side of the wiring board 1 is referred to as an upper side or one side, and a solder resist layer 70 side of the wiring board 1 is referred to as a lower side or the other side. Further, a surface of each component at the solder resist layer 60 side is referred to as an upper surface or one surface, and a surface of each component at the solder resist layer 70 side is referred to as a lower surface or the other surface. However, the wiring board 1 may be used in an opposite direction or may be used at an arbitrary angle. Further, in this embodiment, "in a plan view" means that an object is seen in a direction that is normal to one surface of the solder resist layer 60, and a "plan shape" means a shape of an object seen in the direction that is normal to the one surface of the solder resist layer 60.

In the wiring board 1, the first wiring layer 10 includes fine wirings 11 and connection wirings 12 that are connected to at least either of an upper conductive layer or a lower conductive layer. As the material of the first wiring layer 10, for example, copper (Cu) or the like may be used. The thickness of the first wiring layer 10 may be, for example, about 5 to 10 μm.

Here, the fine wiring means a wiring whose line/space is less than or equal to 10 μm/10 μm. The line/space of the fine wirings 11 may be, for example, about 3 μm/3 μm to 5 μm/5 μm. The line of the line/space expresses a wiring width and the space of the line/space expresses a space (wiring space) between adjacent wirings. For example, when the line/space is expressed as 10 μm/10 μm, it means that the wiring width of the wiring is 10 μm, and the space between the adjacent wirings is 10 μm.

The insulating layer 20 has a structure in which a first insulating film 21 and a second insulating film 22 are stacked. As the first insulating film 21 and the second insulating film 22, photosensitive insulating resin or non-photosensitive insulating resin (thermosetting resin, for example) may be used. Specifically, as the insulating resin for the first insulating film 21 and the second insulating film 22, for example, epoxy-based resin, imide-based resin, phenol-based resin, cyanate-based resin or the like may be used. The first insulating film 21 and the second insulating film 22 may include filler such as silica or alumina. Here, the same insulating resin may be used, or different insulating resin may be used for the first insulating film 21 and the second insulating film 22.

The first insulating film 21 covers a side surface and a lower surface of the first wiring layer 10, and exposes an upper surface of the first wiring layer 10. In other words, the first wiring layer 10 is embedded in the first insulating film 21, and the upper surface of the first wiring layer 10 is exposed from an upper surface of the first insulating film 21. The upper surface of the first insulating film 21 and the upper surface of the first wiring layer 10 may be flush with each other, for example.

The second insulating film 22 contains inside the electronic component 30. The electronic component 30 includes a main body 31 and electrodes 32. The second insulating film 22 covers a side surface and a lower surface of each of the electrodes 32 and exposes an upper surface of each of the electrodes 32. The electronic component 30 may be a passive component such as a chip capacitor (a chip ceramic capacitor, for example), a chip inductor or a chip resistor, for example. Alternatively, as will be described later, the electronic component 30 may be an active component such as a semiconductor chip or a stacked body of semiconductor chips. When the electronic component 30 is a chip capacitor, the plan shape of the electrode 32 of the electronic component 30 may be a rectangular shape of about 500×350 μm, for example. Further, when the electronic component 30 is a chip ceramic capacitor, the main body 31 of the electronic component 30 may have a rectangular parallelepiped shape, and the electrodes 32 are provided at both end portions of the main body 31 in a longitudinal direction. Then, each of the electrodes 32 is provided to continuously cover a respective side surface and upper and lower surfaces of the main body 31.

The first insulating film 21 of the insulating layer 20 is provided with via holes 20x each of which is open at an upper surface of the first insulating film 21 and exposes an upper surface of the respective electrode 32 of the electronic component 30. In this embodiment, the connection wirings 12 are formed above the electrodes 32 of the electronic component 30, respectively. Each of the via holes 20x is formed by a through-hole 12x formed in the respective connection wiring 12 positioned above the respective electrode 32 of the electronic component 30, and a through-hole 21x penetrating the first insulating film 21 positioned between the respective connection wiring 12 and the respective electrode 32 of the electronic component 30, that are communicating with each other.

Further, the second insulating film 22 of the insulating layer 20 is provided with via holes 20y each of which is open at a lower surface of the second insulating film 22 and exposes a lower surface of the respective electrode 32 of the electronic component 30. Further, The first insulating film 21 and the second insulating film 22 of the insulating layer 20 are provided with via holes 20z each of which is open at the lower surface of the second insulating film 22 and exposes a lower surface of the respective connection wiring 12 of the first wiring layer 10.

Here, although two of the via holes 20x are provided for each of the electrodes 32 of the electronic component 30 in the example illustrated in FIG. 1B, at least one via hole 20x may be provided for each of the electrodes 32. It is also possible to provide three or more of the via holes 20x for each of the electrodes 32. These are the same for the via holes 20y.

The second wiring layer 40 includes a wiring pattern formed on the upper surface of the first wiring layer 10 and via wirings that are extended from the wiring pattern to be extended in the via holes 20x and directly connected to the electrodes 32 of the electronic component 30, respectively. At the portion "A", the plan shape of the wiring pattern of the second wiring layer 40 (pad) connected to the respective electrode 32 of the electronic component 30 may be a circular shape, for example.

For example, when the plan shape of the electrode 32 of the electronic component 30 is a rectangular shape of about 500×350 μm, the diameter of the via wiring at an electrode 32 side (the diameter of the via hole 20x at the electrode 32 side) may be about 60 to 100 μm. In such a case, at the portion "A", the diameter of the pad of the second wiring layer 40 connected to the respective electrode 32 of the electronic component 30 may be about 90 to 200 μm.

The wiring pattern of the second wiring layer 40 may extend from the upper surface of the first wiring layer 10 to the upper surface of the insulating layer 20 (upper surface of the first insulating film 21). The via wiring of the second wiring layer 40 is electrically connected to the respective connection wiring 12 and the respective electrode 32 by contacting an inner wall surface of the connection wiring 12 positioned above the electrode 32 of the electronic component 30 and the upper surface of the electrode 32 of the electronic component 30. This means that, the first wiring layer 10 is connected to the electrode 32 of the electronic component 30 through the via wiring of the second wiring layer 40.

The second wiring layer 40 includes a first layer 41, a second layer 42 and a third layer 43. The first layer 41 is directly formed on the upper surface of the connection wiring 12. The first layer 41 that is positioned above the electrode 32 of the electronic component 30 is provided with a through-hole 41x communicating with the respective via hole 20x. The second layer 42 is directly formed on the first layer 41. At the portion "A", the second layer 42 is extended from above the first layer 41 to be formed along inner walls of the through-hole 41x and the via hole 20x, and further covers the upper surface of the electrode 32 of the electronic component 30 that is exposed in the via hole 20x. The third layer 43 is directly formed on the second layer 42. At the portion "A", the third layer 43 is extended from above the second layer 42 to fill the through-hole 41x and the via hole 20x on the inner walls of which the second layer 42 is formed.

As the material of each of the first layer 41, the second layer 42 and the third layer 43, for example, copper or the like may be used. The thickness of the first layer 41 that composes the wiring pattern of the second wiring layer 40 may be, for example, about 1.5 to 5 µm. The thickness of the second layer 42 that composes the wiring pattern of the second wiring layer 40 may be, for example, about 0.5 to 1 µm. The thickness of the third layer 43 that composes the wiring pattern of the second wiring layer 40 may be, for example, about 4 to 19 µm.

The third wiring layer 50 includes a wiring pattern formed on the lower surface of the second insulating film 22 of the insulating layer 20 and via wirings that are extended from the wiring pattern to be extended in the via holes 20y or 20z. The wiring pattern of the third wiring layer 50 may include a wiring that is not connected to the via wiring.

The third wiring layer 50 includes a first layer 51 and a second layer 52. The first layer 51 is formed on the lower surface of the second insulating film 22. At the portion "A", the first layer 51 extends from the lower surface of the second insulating film 22 to be formed along an inner wall of the respective via hole 20y, and further covers a lower surface of the electrode 32 of the electronic component 30 that is exposed in the via hole 20y. At a portion other than the portion "A", the first layer 51 extends from the lower surface of the second insulating film 22 to be formed along an inner wall of the respective via hole 20z, and further covers a lower surface of the connection wiring 12 of the first wiring layer 10 that is exposed in the via hole 20z.

The second layer 52 is directly formed on the first layer 51. At the portion "A", the second layer 52 extends from above the first layer 51 to fill the via hole 20y on the inner wall of which the first layer 51 is formed. At the portion other than the portion "A", the second layer 52 is extended from above the first layer 51 to fill the via hole 20z on the inner wall of which the first layer 51 is formed.

As the material of each of the first layer 51 and the second layer 52, for example, copper or the like may be used. The thickness of the first layer 51 that composes the wiring pattern of the third wiring layer 50 may be, for example, about 0.5 to 1 µm. The thickness of the second layer 52 that composes the wiring pattern of the third wiring layer 50 may be, for example, about 4 to 19 µm.

The solder resist layer 60 is formed on the upper surface of the first insulating film 21 of the insulating layer 20 so as to cover the upper surface of the first wiring layer 10 and an upper surface and a side surface of the second wiring layer 40. The solder resist layer 60 is provided with open portions 60x from each of which the wiring pattern of the second wiring layer 40 is selectively exposed. The wiring pattern of the second wiring layer 40 exposed from each of the open portions 60x is a connection pad for a semiconductor chip.

The wiring pattern of the second wiring layer 40 includes wirings connected to the via wirings of the second wiring layer 40 and wirings that are not connected to the via wirings. Here, the wirings connected to the via wirings and the wirings that are not connected to the via wirings of the wiring pattern have the same height (same thickness on the first insulating film 21).

The solder resist layer 70 is formed on the second insulating film 22 of the insulating layer 20 so as to cover the third wiring layer 50. The solder resist layer 70 is provided with open portions 70x, and the wiring pattern of the third wiring layer 50 is selectively exposed in each of the open portions 70x. The wiring pattern of the third wiring layer 50 exposed in each of the open portions 70x is a connection pad for another wiring board or the like.

As the material of the solder resist layers 60 and 70, for example, photosensitive epoxy-based insulating resin, acryl-based insulating resin or the like may be used. The thickness of each of the solder resist layers 60 and 70 may be, for example, about 5 to 40 µm.

In accordance with necessity, a metal layer may be provided on the upper surface of the second wiring layer 40 exposed in each of the open portions 60x, or on the lower surface of the third wiring layer 50 exposed in each of the open portions 70x. As an example of the metal layer, an Au layer, a Ni/Au layer (a metal layer in which a Ni layer and an Au layer are stacked in this order), a Ni/Pd/Au layer (a metal layer in which a Ni layer, a Pd layer and an Au layer are stacked in this order) or the like may be used. Alternatively, instead of foaming the metal layer, an antioxidation process such as an Organic Solderability Preservative (OSP) process may be performed. A surface treatment layer formed by the OSP process is an organic coating film composed of an azole compound, an imidazole compound or the like.

Further, a terminal for external connection such as a solder ball may be provided on the upper surface of the second wiring layer 40 exposed in each of the open portions 60x, or on the lower surface of the third wiring layer 50 exposed in each of the open portions 70x.

(Method of Manufacturing Wiring Board of First Embodiment)

Next, a method of manufacturing the wiring board 1 of the first embodiment is described. FIG. 2A to 5C are views illustrating an example of manufacturing steps of the wiring board 1 of the first embodiment. In this embodiment, an example of manufacturing steps is described in which parts corresponding to a plurality of wiring boards are manufactured on a support body, and after removing the support body, the plurality of wiring boards are manufactured by individualizing the parts. Alternatively, as another example of manufacturing steps, a single wiring board may be manufactured on a support body and the support body may be removed to obtain the wiring board.

Figure 2A:
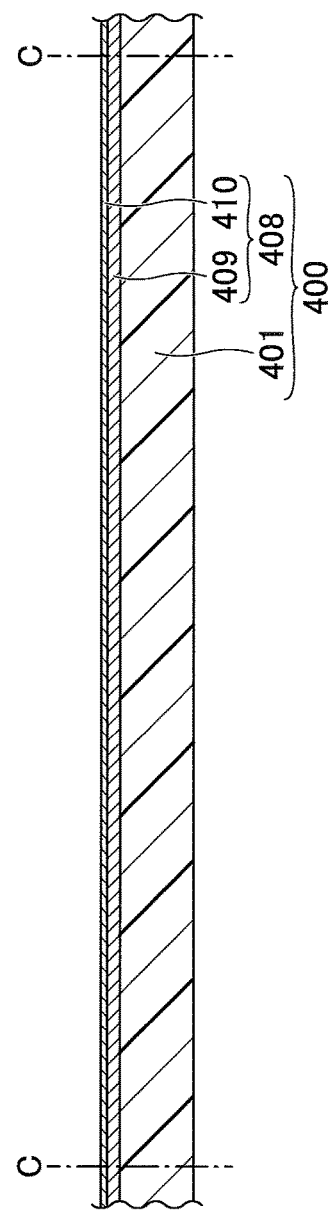
FIG. 2A to FIG. 2D are views illustrating an example of manufacturing steps of the wiring board of the first embodiment.

First, in a step illustrated in FIG. 2A, a support body 400 whose outermost layer is a metal foil 408 is prepared. As the support body 400, for example, a prepreg 401 on which the metal foil with a carrier 408 is stacked may be used. The thickness of the support body 400 may be, for example, about 18 to 100 µm.

The prepreg 401 may be, for example, obtained by impregnating woven cloth or nonwoven cloth (not illustrated in the drawings) such as a glass fiber or an aramid fiber with insulating resin such as epoxy-based resin. The metal foil with the carrier 408 has a structure in which a thin foil 410 composed of a metal foil made of copper or the like with a thickness of about 1.5 to 5 μm is detachably stuck on a thick foil (carrier foil) 409 composed of a metal foil made of copper or the like with a thickness of about 10 to 50 μm through a peeling layer (not illustrated in the drawings). The thick foil 409 is provided as a support material for facilitating handling of the thin foil 410. A lower surface of the thick foil 409 is adhered at an upper surface of the prepreg 401.

Figure 2B:
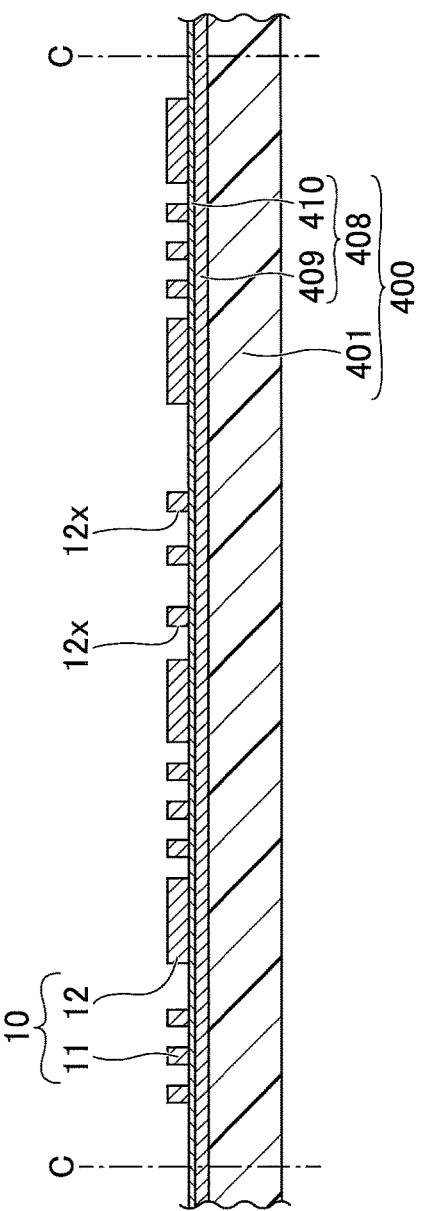
Figure 2C:
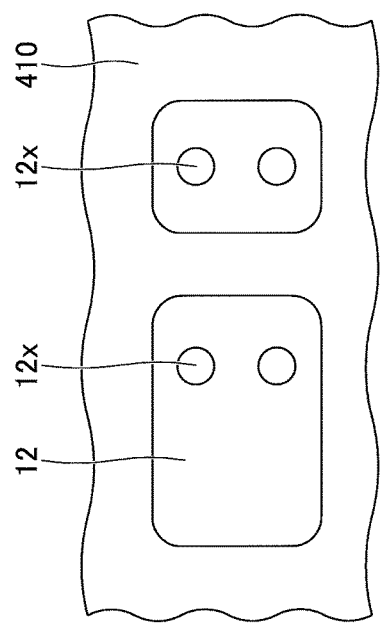

Next, in a step illustrated in FIG. 2B and FIG. 2C, the first wiring layer 10 including the fine wirings 11 and the connection wirings 12 is formed on an upper surface of the thin foil 410 of the support body 400. Specifically, for example, a resist layer (dry film resist or the like) provided with open portions corresponding to parts where the first wiring layer 10 is formed, is formed on the upper surface of the thin foil 410 of the support body 400. Then, by electrolytic plating in which the metal foil with the carrier 408 is used as a power supply layer, the first wiring layer 10 is formed by depositing copper or the like at the upper surface of the thin foil 410 that is exposed in each of the open portions of the resist layer. Thereafter, by removing the resist layer using peeling solution, the first wiring layer 10 including the fine wirings 11 and the connection wirings 12 is formed on the upper surface of the thin foil 410 of the support body 400. As illustrated in FIG. 2C, which is an enlarged plan view of a portion of FIG. 2B, the through-holes 12x are previously formed at regions of the first wiring layer 10 where the electrodes 32 of the electronic component 30 are to be provided.

Figure 2D:
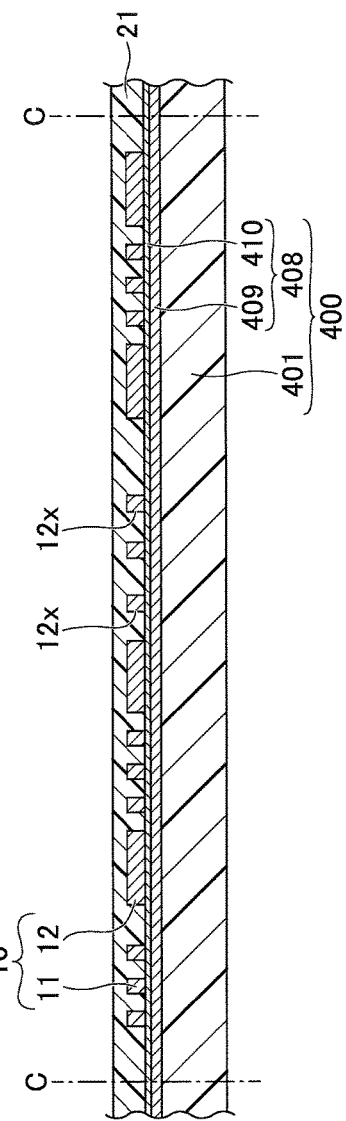

Next, in a step illustrated in FIG. 2D, the first insulating film 21 is formed on the upper surface of the thin foil 410 to cover the other surface and the side surfaces of the first wiring layer 10. Specifically, the first insulating film 21 may be formed by laminating a thermosetting epoxy-based insulating resin film or the like on the upper surface of the thin foil 410 to cover the first wiring layer 10. The through-holes 12x are blocked by the first insulating film 21. At this time, the first insulating film 21 is not completely cured but remained at a B-stage state (semi-cured state).

Figure 3A:
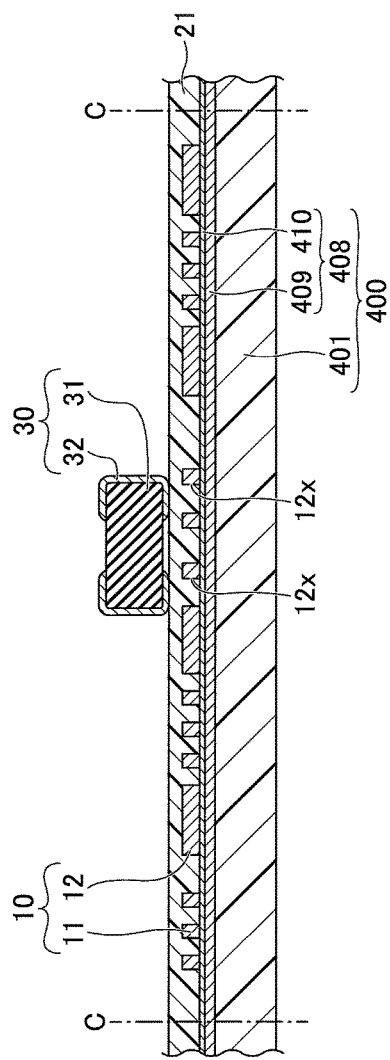
FIG. 3A to FIG. 3D are views illustrating an example of the manufacturing steps of the wiring board of the first embodiment.

Next, in a step illustrated in FIG. 3A, the electronic component 30 including the main body 31 and the electrodes 32 is prepared. The electronic component 30 is mounted on the first insulating film 21 such that the electrodes 32 are positioned above the through-holes 12x, respectively. As the first insulating film 21 is at the B-stage state, the electronic component 30 is temporarily fixed on the first insulating film 21 by the viscosity of the first insulating film 21. The electronic component 30 may be mounted on the first insulating film 21 using a chip mounter or the like, for example. In a step illustrated in FIG. 2D, it is preferable to heat the first insulating film 21 at temperature at which the first insulating film 21 can be maintained at the B-stage state (semi-cured state) and have stickiness so that adhesion between the electronic component 30 and the first insulating film 21 is improved.

Figure 3B:
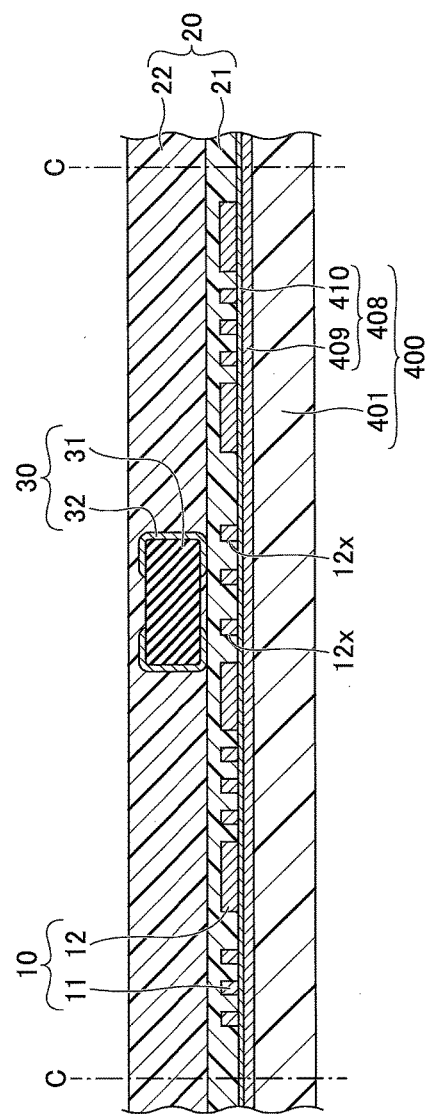

Next, in a step illustrated in FIG. 3B, the second insulating film 22 is formed on the first insulating film 21 to cover the electronic component 30. Specifically, the second insulating film 22 may be formed by laminating a thermosetting epoxy-based insulating resin film or the like on the first insulating film 21 to cover the electronic component 30, for example. Then, while pushing the first insulating film 21 and the second insulating film 22 toward the support body 400, the first insulating film 21 and the second insulating film 22 are heated at temperature greater than curing temperature to be cured and to manufacture the insulating layer 20 including the first insulating film 21 and the second insulating film 22.

Figure 3C:
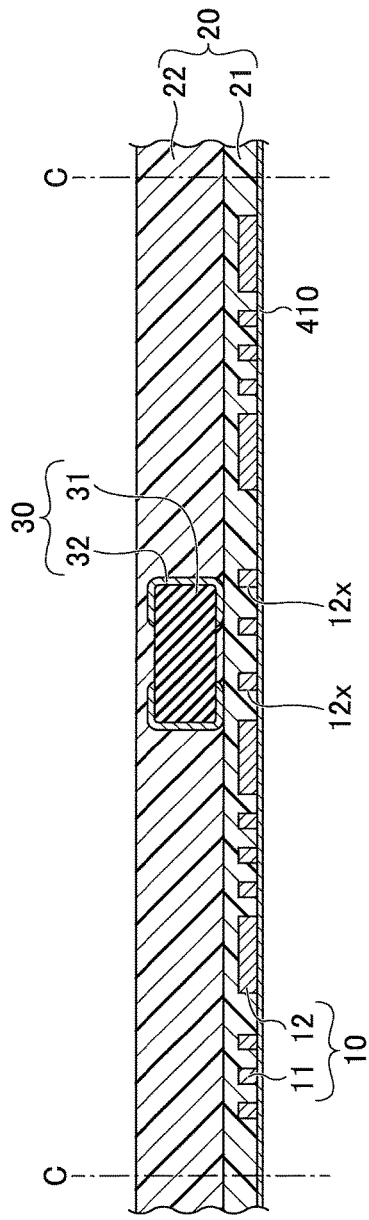

Next, in a step illustrated in FIG. 3C, a part of the support body 400 is removed from the structure body illustrated in FIG. 3B. Specifically, by applying mechanical force to the support body 400, an interface between the thin foil 410 and the thick foil 409 of the metal foil with the carrier 408 is peeled. As described above, the metal foil with the carrier 408 has a structure in which the thick foil 409 is stuck on the thin foil 410 via the peeling layer (not illustrated in the drawings). Thus, the thick foil 409 can easily be removed from the thin foil 410 with the peeling layer (not illustrated in the drawings).

With this, only the thin foil 410 remains at the insulating layer 20, and other members (the prepreg 401 and the thick foil 409) composing the support body 400 are removed. Here, in addition to a case that the thick foil 409 is removed from the thin foil 410 with the peeling layer, the thick foil 409 may be removed from the thin foil 410 by cohesion failure occurred in the peeling layer. Further, the thick foil 409 may be removed from the thin foil 410 because the thick foil 409 is peeled from the peeling layer.

Figure 3D:
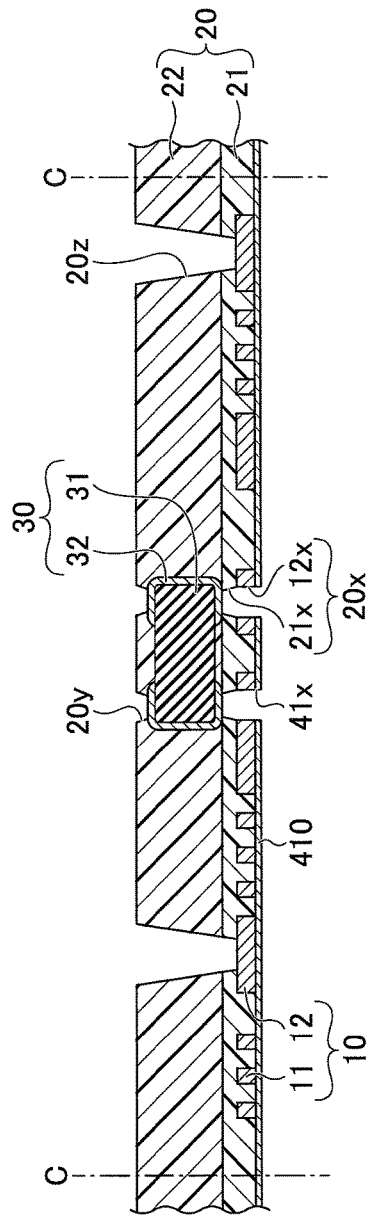

Next, in a step illustrated in FIG. 3D, the through-holes 41x are formed in the thin foil 410. Further, the via holes 20x, 20y and 20z are formed in the insulating layer 20.

Specifically, first, the through-holes 41x communicating with the through-holes 12x, respectively, are formed in the thin foil 410 by irradiating laser on the thin foil 410 at positions corresponding to the through-holes 12x, respectively. Then, by continuously irradiating laser, the first insulating film 21 in the through-holes 12x is removed and the first insulating film 21 positioned between the connection wirings 12 of the first wiring layer 10 and the electrodes 32 of the electronic component 30 is also removed. With this, the through-holes 21x that expose the one surfaces of the electrodes 32 of the electronic component 30, respectively, are formed. The via hole 20x is formed by the through-hole 12x and the through-hole 21x communicating with each other. For forming the via holes 20y and 20z, laser may be irradiated at predetermined positions of the second insulating film 22 and the first insulating film 21 of the insulating layer 20.

Here, when the via holes 20x are formed by laser processing, it is preferable that resin residue of the insulating layer 20 adhered on the electrodes 32 of the electronic component 30 exposed in the via holes 20x is removed by performing a desmear process. This is the same for the via holes 20y and 20z.

Figure 4A:
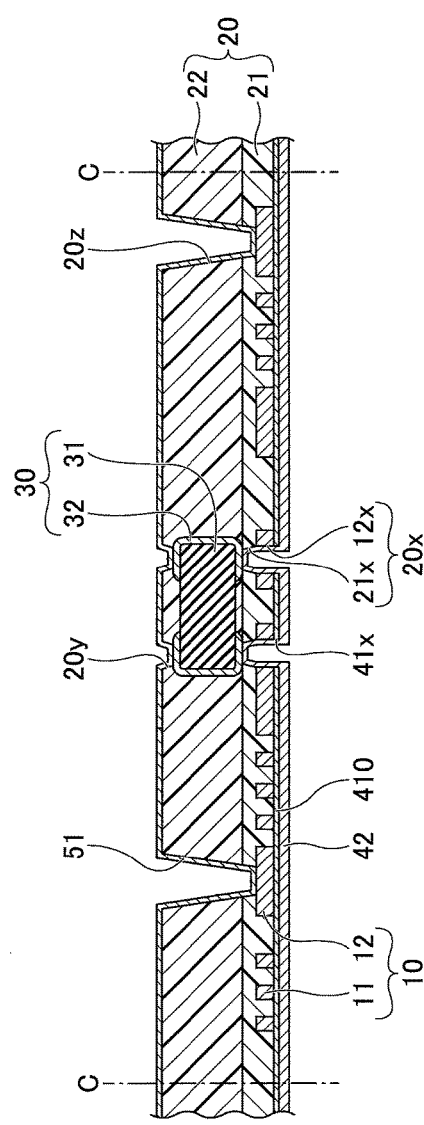
FIG. 4A to FIG. 4C are views illustrating an example of the manufacturing steps of the wiring board of the first embodiment.

Next, in steps illustrated in FIG. 4A to FIG. 5B, the second wiring layer 40 and the third wiring layer 50 are formed. The second wiring layer 40 and the third wiring layer 50 may be, for example, formed by a semi-additive process. When forming the second wiring layer 40 and the third wiring layer 50 by the semi-additive process, first, as illustrated in FIG. 4A, the second layer 42 and the first layer 51, as seed layers, that are metal layers made of copper (Cu) or the like are formed by electroless plating or sputtering.

The second layer 42 is formed to continuously cover the entirety of the one surface of the thin foil 410, an inner wall surface of each of the through-holes 41x, an inner wall surface of each of the via holes 20x and the one surface of the electrode 32 of the electronic component 30 that is exposed in each of the via holes 20x. The first layer 51 is formed to continuously cover the entirety of the other surface of the second insulating film 22, an inner wall surface of each of the via holes 20y, the other surface of the electrode 32 of the electronic component 30 exposed in each of the via holes 20y, an inner wall surface of each of the via holes 20z and the other surface of the connection wiring 12 exposed in each of the via holes 20z.

Figure 4B:
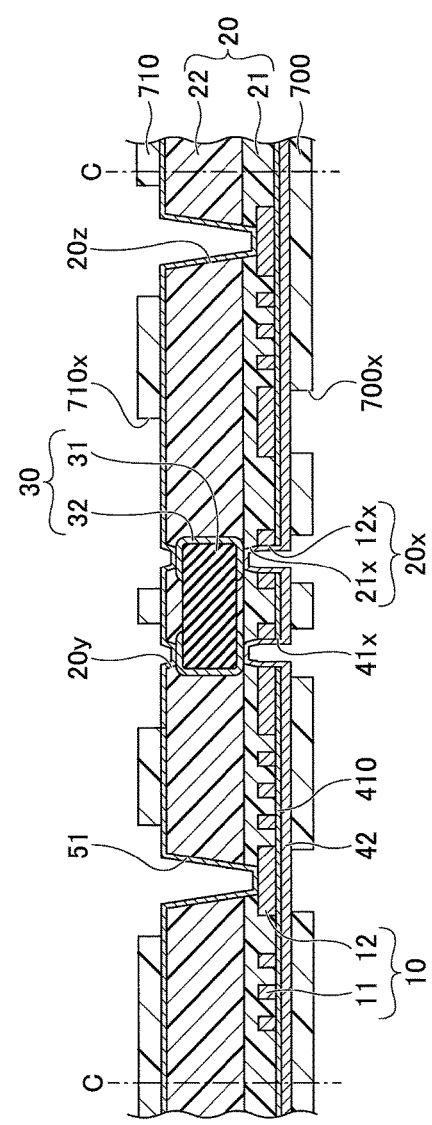

Next, as illustrated in FIG. 4B, a resist layer 700 (dry film resist or the like) provided with open portions 700x corresponding to the second wiring layer 40 is formed on the second layer 42. Similarly, a resist layer 710 (dry film resist or the like) provided with open portions 710x corresponding to the third wiring layer 50 is formed on the first layer 51.

Figure 4C:
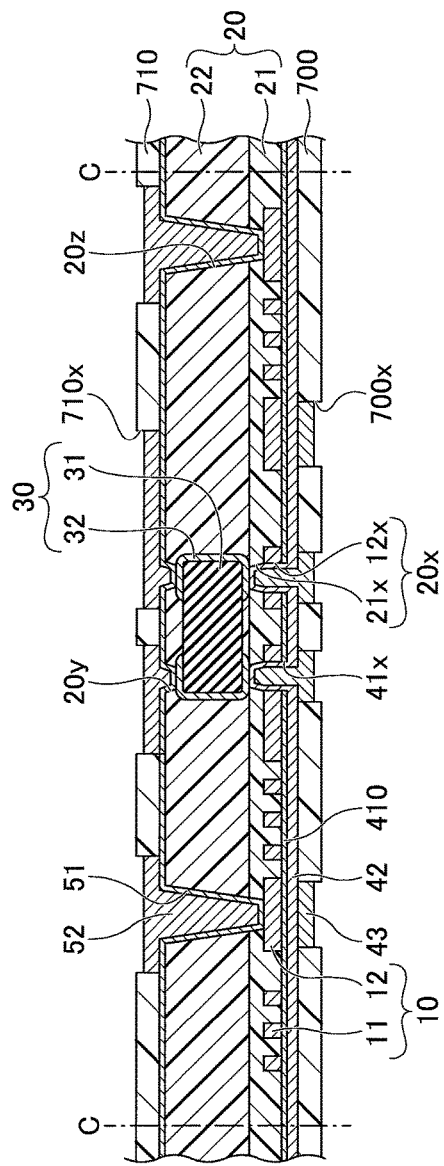

Next, as illustrated in FIG. 4C, the third layer 43, which is an electrolytic plating layer, is formed by depositing copper or the like in the open portions 700x of the resist layer 700 by electrolytic plating using the second layer 42, which is the seed layer, as a power supply layer. Similarly, the second layer 52, which is an electrolytic plating layer, is formed by depositing copper or the like in the open portions 710x of the resist layer 710 by electrolytic plating using the first layer 51, which is the seed layer, as a power supply layer.

Figure 5A:
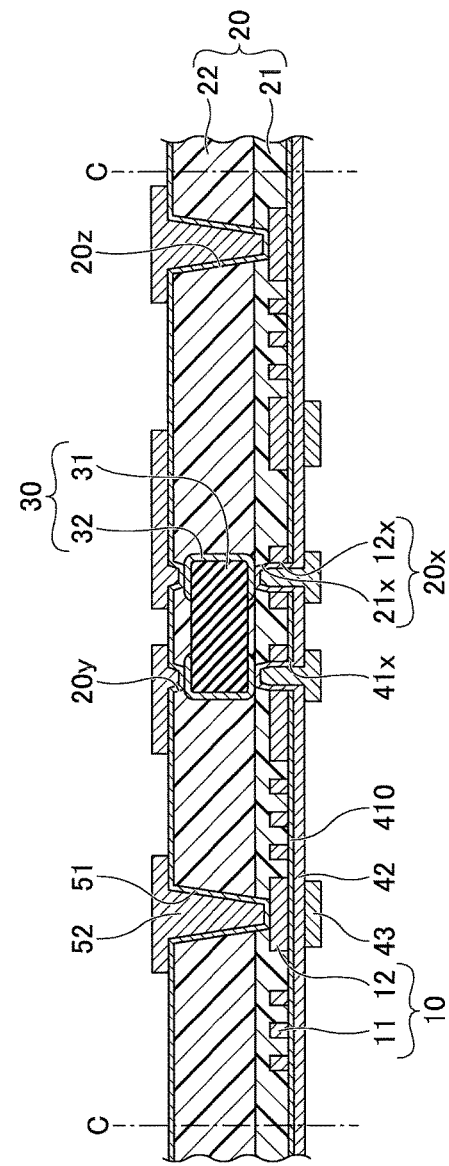
FIG. 5A to FIG. 5C are views illustrating an example of the manufacturing steps of the wiring board of the first embodiment.
Figure 5B:
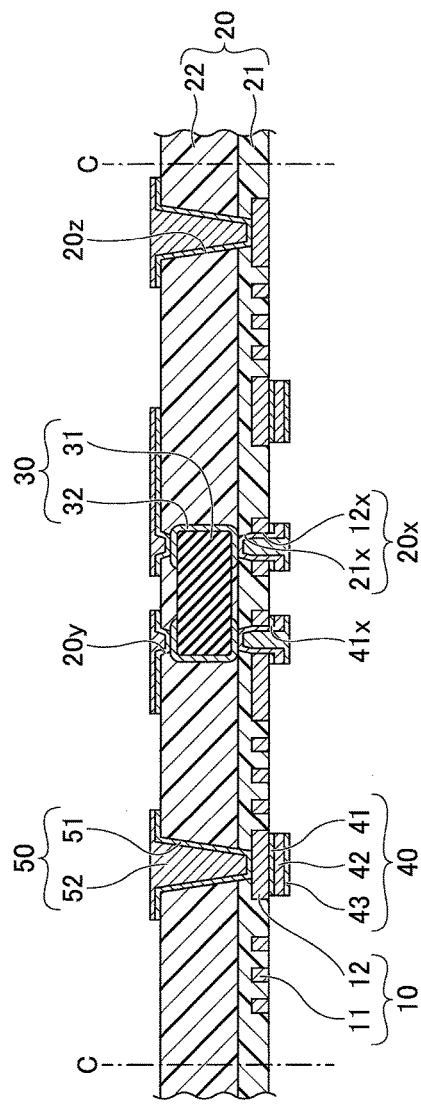

Next, after removing the resist layers 700 and 710 as illustrated in FIG. 5A, as illustrated in FIG. 5B, using the third layer 43 as a mask, parts of the second layer 42 and the thin foil 410 that are not covered by the third layer 43 are removed. With this, the first layer 41 is formed from the thin foil 410, and the second wiring layer 40 including the first layer 41, the second layer 42 and the third layer 43 is formed. Similarly, using the second layer 52 as a mask, parts of the first layer 51 that are not covered by the second layer 52 are removed by etching. With this, the third wiring layer 50 including the first layer 51 and the second layer 52 is formed. When the layer to be removed is made of copper, for example, etching solution such as hydrogen peroxide/sulfuric acid-based aqueous solution, sodium persulfate aqueous solution or ammonium persulfate aqueous solution may be used, for example.

Figure 5C:
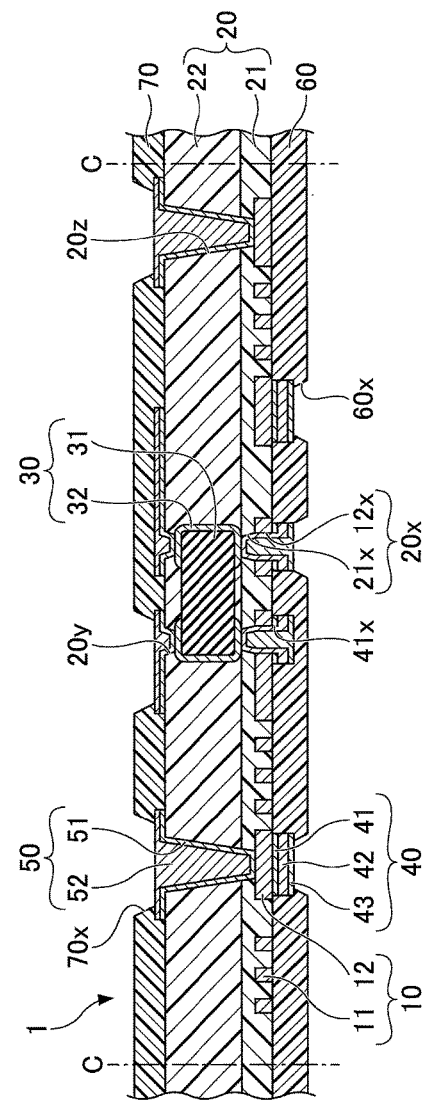

Next, in a step illustrated in FIG. 5C, a solder resist layer 60 that covers the first wiring layer 10 and the second wiring layer 40 is formed on the one surface of the first insulating film 21 of the insulating layer 20. Further, a solder resist layer 70 that covers the third wiring layer 50 is formed on the other surface of the second insulating film 22 of the insulating layer 20. The solder resist layer 60 may be formed by, for example, coating liquid or paste insulating resin to cover the first wiring layer 10 and the second wiring layer 40 by screen printing, roll coating, spin coating or the like. Alternatively, an insulating resin film may be laminated to cover the first wiring layer 10 and the second wiring layer 40. As the insulating resin, for example, photosensitive epoxy-based insulating resin, acryl-based insulating resin or the like may be used. The solder resist layer 70 may be similarly formed.

Then, by exposing and developing the coated or laminated insulating resin, open portions 60x that selectively expose the second wiring layer 40 are formed in the solder resist layer 60 (photolithography). Similarly, open portions 70x that selectively expose the third wiring layer 50 are formed in the solder resist layer 70 (photolithography). When non-photosensitive insulating resin (thermosetting resin) whose main constituent is epoxy-based resin or polyimide-based resin is used as the material of the solder resist layers 60 and 70, the open portions 60x and the 70x may be formed by laser processing, blasting or the like.

In accordance with necessity, a metal layer may be formed on each of the one surface of the second wiring layer 40 exposed in each of the open portions 60x and the other surface of the third wiring layer 50 exposed in each of the open portions 70x by electroless plating or the like, for example. An example of the metal layer is described above. Further, an antioxidation process such as an OSP process may be performed on the one surface of the second wiring layer 40 exposed in each of the open portions 60x or the other surface of the third wiring layer 50 exposed in each of the open portions 70x.

After the step illustrated in FIG. 5C, the structure body illustrated in FIG. 5C is cut at cut positions C by a slicer or the like to be individualized, and a plurality of the wiring boards 1 are completed (see FIG. 1A and FIG. 1B). In accordance with necessity, terminals for external connection such as solder balls may be provided on the second wiring layer 40 exposed in the open portions 60x of the solder resist layer 60, and on the third wiring layer 50 exposed in the open portions 70x of the solder resist layer 70.

As such, according to the wiring board 1, the electronic component 30 contained inside the insulating layer 20 and the first wiring layer 10 embedded in the insulating layer 20 are connected through the via wiring that is filled in the via hole 20x that is open at the one surface of the insulating layer 20 and expose the one surface of the electrode 32 of the electronic component 30. In such a structure, as the via wiring is directly connected to the one surface of the electrode 32 of the electronic component 30 and does not interpose a conductive paste between the electrode 32 of the electronic component 30, connection reliability between the electronic component 30 and the first wiring layer 10 can be improved.

Further, the structure for connecting the electronic component 30 and the first wiring layer 10 by the via wiring can be actualized with a smaller space compared with a structure in which they are connected through a conductive paste. Thus, a space for providing the fine wirings 11 of the first wiring layer 10 can be enlarged. As a result, degree of design freedom of the fine wirings 11 of the first wiring layer 10 can be improved. Here, the reason why a large space is required for the structure in which they are connected through the conductive paste is as follows. It is necessary to make a size of a pad provided at the first wiring layer 10 to be larger than the size of the electrode 32 in order to form a fillet of the conductive paste at a side surface of the electrode 32 of the electronic component 30.

In the wiring board 1, the wirings connected to the via wirings and the wirings that are not connected to the via wirings are at the same height (same thickness) in the first wiring layer 10. Thus, even for a case that both the wirings connected to the via wirings and the wirings that are not connected to the via wirings are used for the semiconductor chip connection pads, gaps between the semiconductor chip connection pads and the electrode pads of the semiconductor chip to be mounted become constant, respectively. As a result, connection reliability between the first wiring layer 10 and the semiconductor chip can be improved.

Alternative Example 1 of First Embodiment

In an alternative example 1 of the first embodiment, an example is described in which the through-holes 12x are not formed in the connection wirings 12. In the alternative example 1 of the first embodiment, for the same components that are already described above, descriptions are sometimes not repeated.

Figure 6A:
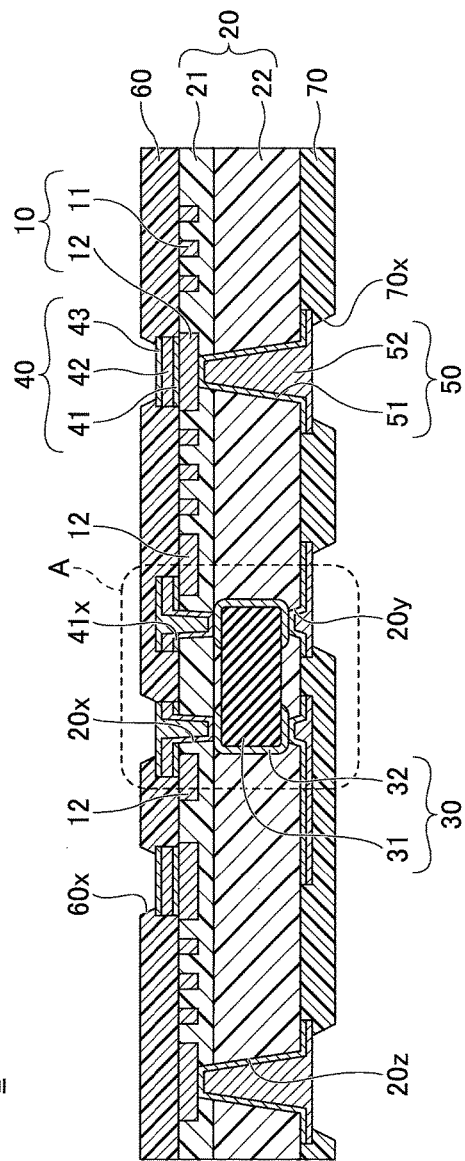
FIG. 6A and FIG. 6B are views illustrating an example of a wiring board of an alternative example 1 of the first embodiment.
Figure 6B:
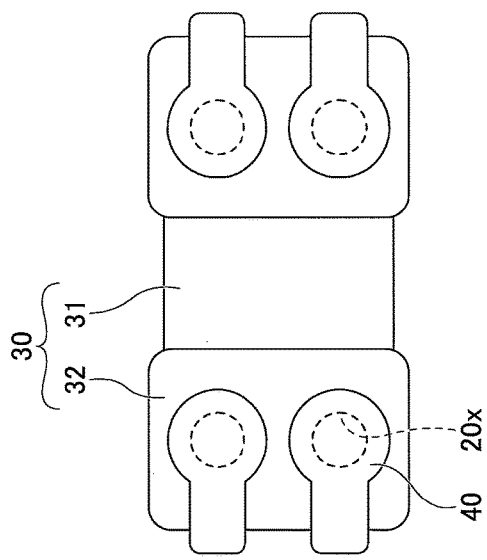

FIG. 6A and FIG. 6B are views illustrating an example of a wiring board 2 of the alternative example 1 of the first embodiment. FIG. 6A is a cross-sectional view, and FIG. 6B is an enlarged plan view of a portion "A" in FIG. 6A.

However, the first wiring layer 10, the insulating layer 20 and the solder resist layer 60 are not illustrated in FIG. 6B.

With reference to FIG. 6A and FIG. 6B, the wiring board 2 is different from the wiring board 1 (see FIG. 1A and FIG. 1B) in that the through-holes 12x are not formed in the connection wirings 12. In other words, in the wiring board 2, the connection wirings 12 of the first wiring layer 10 are not provided at positions where the via holes 20x are to be formed.

In the wiring board 2, at the portion "A", the second wiring layer 40 formed on the insulating layer 20 extends above the connection wiring 12 of the first wiring layer 10 that is provided in the vicinity of a position at which the via hole 20x is to be formed, and the first wiring layer 10 and the second wiring layer 40 are electrically connected with each other. This means that the first wiring layer 10 is connected with the electrodes 32 of the electronic component 30 through the wiring pattern of the second wiring layer 40 and the via wirings.

For manufacturing the wiring board 2, first, steps same as those of FIG. 2A to FIG. 3C of the first embodiment are performed. Here, the first wiring layer 10 is not formed at positions where the via holes 20x are to be formed.

Figure 7A:
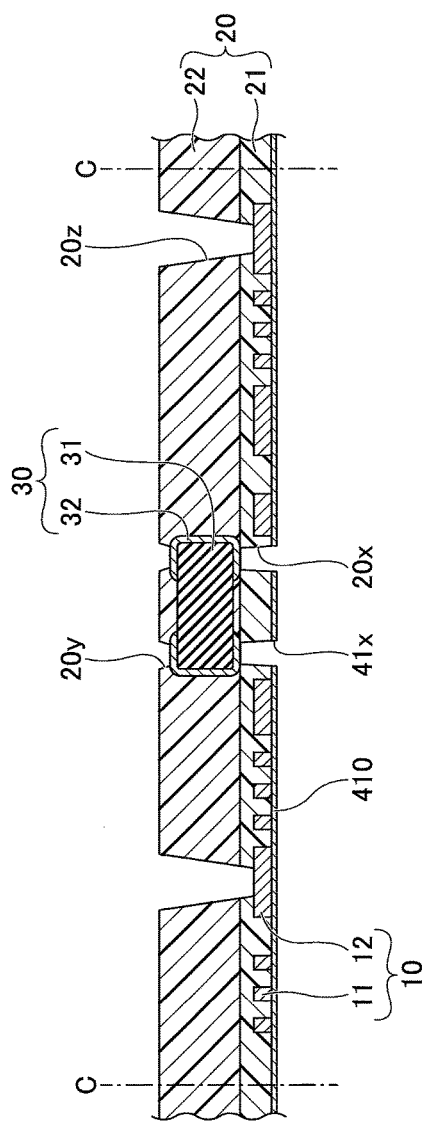
FIG. 7A to FIG. 7C are views illustrating an example of manufacturing steps of the wiring board of the alternative example 1 of the first embodiment.

Next, as illustrated in FIG. 7A, the through-holes 41x are formed in the thin foil 410. Further, the via holes 20x, 20y and 20z are formed in the insulating layer 20. Specifically, by irradiating laser on the first insulating film 21 through the thin foil 410, the through-holes 41x are formed in the thin foil 410, and the via holes 20x that are communicating with the through-holes 41x are formed by removing the first insulating film 21 between the thin foil 410 and the electrodes 32 of the electronic component 30. The electrodes 32 of the electronic component 30 are exposed in the via holes 20x, respectively. For forming the via holes 20y and 20z, laser may be irradiated at predetermined positions of the second insulating film 22 and the first insulating film 21 of the insulating layer 20.

Figure 7B:
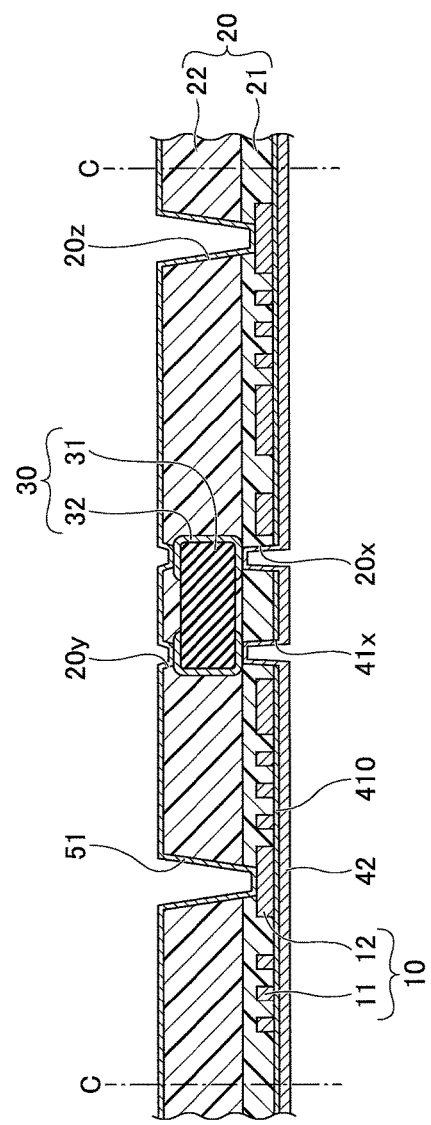

Next, as illustrated in FIG. 7B, similar to the step illustrated in FIG. 4A, the second layer 42 and the first layer 51, as seed layers, made of copper (Cu) or the like are formed by electroless plating or sputtering.

Figure 7C:
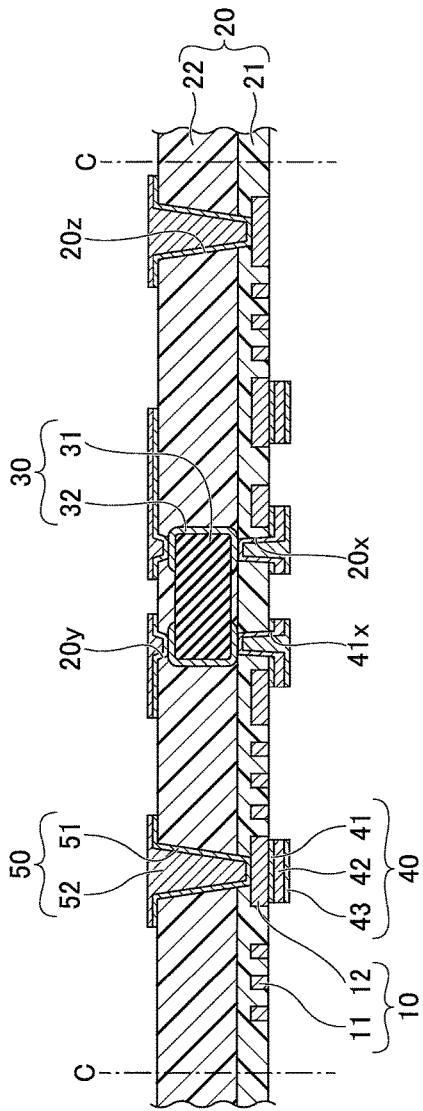

Next, similar to the steps illustrated in FIG. 4B to FIG. 5B, a structure body illustrated in FIG. 7C is manufactured. Thereafter, after performing the step similar to that of FIG. 5C, and cutting the structure body at cut positions C by a slicer or the like to be individualized, a plurality of the wiring boards 2 (see FIG. 6A and FIG. 6B) are completed.

As such, it is unnecessary to form the through-holes 12x in the connection wirings 12 as the wiring board 1, and the via holes 20x may be formed at a region of the insulating layer 20 where the connection wirings 12 are not formed.

However, when the through-holes 12x are formed in the connection wirings 12 and the via holes 20x are formed by forming the through-holes 21x that are communicating with the through-holes 12x, respectively, as the first embodiment, the diameter of each of the via holes 20x can be determined by the diameter of the respective through-hole 12x. Thus, the size of the via hole 20x can be prevented from being unnecessarily enlarged. Further, as the position at which the via hole 20x is formed can be determined by the position of the through-hole 12x, accuracy in position of the via hole 20x can be increased.

Alternative Example 2 of First Embodiment

In an alternative example 2 of the first embodiment, an example is described in which a structure of the insulating layer that includes the electronic component 30 is different. In the alternative example 2 of the first embodiment, for the same components that are already described above, descriptions are sometimes not repeated.

Figure 8:
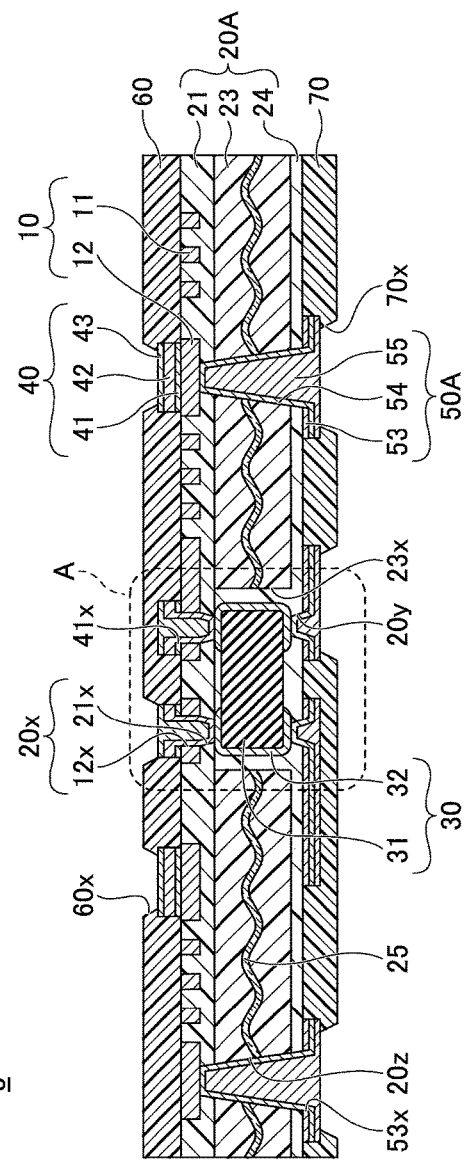
FIG. 8 is a cross-sectional view illustrating an example of a wiring board of an alternative example 2 of the first embodiment.

FIG. 8 is a cross-sectional view illustrating an example of a wiring board 3 of an alternative example 2 of the first embodiment. With reference to FIG. 8, the wiring board 3 is different from the wiring board 1 (see FIG. 1A and FIG. 1B) in that the insulating layer 20 and the third wiring layer 50 are substituted by an insulating layer 20A and a third wiring layer 50A.

The insulating layer 20A includes the first insulating film 21, a second insulating film 23 and a third insulating film 24. The first insulating film 21, the second insulating film 23 and the third insulating film 24 are stacked. The second insulating film 23 is provided with an electronic component housing portion 23x which is an opening penetrating the second insulating film 23. A lower surface of the first insulating film 21 and a lower end surface of the second layer 42 that composes the via wirings of the second wiring layer 40 are exposed in the electronic component housing portion 23x. The electronic component 30 is placed in the electronic component housing portion 23x of the second insulating film 23, and the electrodes 32 of the electronic component 30 and the second layer 42 of the second wiring layer 40 that composes the via wirings are directly connected.

The second insulating film 23 include a reinforcing member 25. More specifically, the second insulating film 23 is so-called glass epoxy-based resin obtained by impregnating reinforcing member 25 such as a glass cloth (glass woven cloth) with thermosetting non-photosensitive resin whose main constituent is epoxy-based resin and curing it, for example. The thermosetting non-photosensitive is not limited to the epoxy-based resin, and other insulating resin such as polyimide-based resin or cyanate-based resin may be used, for example. The second insulating film 23 may include filler such as silica or alumina, for example. Furthermore, as the reinforcing member 25, a woven cloth, a nonwoven cloth or the like such as carbon fiber or aramid fiber may be used instead of the glass cloth.

The third insulating film 24 is formed on a lower surface of the second insulating film 23 and extends in the electronic component housing portion 23x to fill a space formed between the lower surface of the first insulating film 21, an inner wall surface of the electronic component housing portion 23x and the electronic component 30. The material of the third insulating film 24 may be, for example, the same as that of the second insulating film 23. Although the third insulating film 24 does not include a reinforcing member in the example of FIG. 8, similarly as the second insulating film 23, the third insulating film 24 may include a reinforcing member.

The third wiring layer 50A includes a wiring pattern formed on a lower surface of the third insulating film 24 of the insulating layer 20A, and via wirings extended from the wiring pattern and contained in the via holes 20y and 20z. Here, the wiring pattern of the third wiring layer 50A may include wirings that are not connected to the via wirings.

The third wiring layer 50A includes a first layer 53, a second layer 54 and a third layer 55. The first layer 53 is formed on the lower surface of the third insulating film 24. The first layer 53 is provided with through-holes 53x that are communicating with the via holes 20y and 20z, respectively.

The second layer 54 is directly formed on the first layer 53. At the portion "A", the second layer 54 is extended from the first layer 53 to be formed along inner walls of the through-hole 53x and the via hole 20y, and further covers the lower surface of the electrode 32 of the electronic component 30 that is exposed in the via hole 20y. At a portion other than the portion "A", the second layer 54 is extended from the first layer 53 to be formed along inner walls of the through-hole 53x and the via hole 20z, and further covers the lower surface of the connection wiring 12 of the first wiring layer 10 that is exposed in the via hole 20z.

The third layer 55 is directly formed on the second layer 54. At the portion "A", the third layer 55 extends from above the second layer 54 to fill the through-hole 53x and the via hole 20y on the inner wall of each of which the second layer 54 is formed. At the portion other than the portion "A", the third layer 55 is extended from above the second layer 54 to fill the via hole 20z on the inner wall of which the second layer 54 is formed.

As the material of the first layer 53, the second layer 54 and the third layer 55, for example, copper or the like may be used. The thickness of the first layer 53 that composes the wiring pattern of the third wiring layer 50A may be, for example, about 1.5 to 5 μm. The thickness of the second layer 54 that composes the wiring pattern of the third wiring layer 50A may be, for example, about 0.5 to 1 μm. The thickness of the third layer 55 that composes the wiring pattern of the third wiring layer 50A may be, for example, about 4 to 19 μm.

For manufacturing the wiring board 3, first, steps same as those of FIG. 2A to FIG. 3A of the first embodiment are performed. Then, instead of the step of FIG. 3B, a step of FIG. 9A is performed.

Figure 9A:
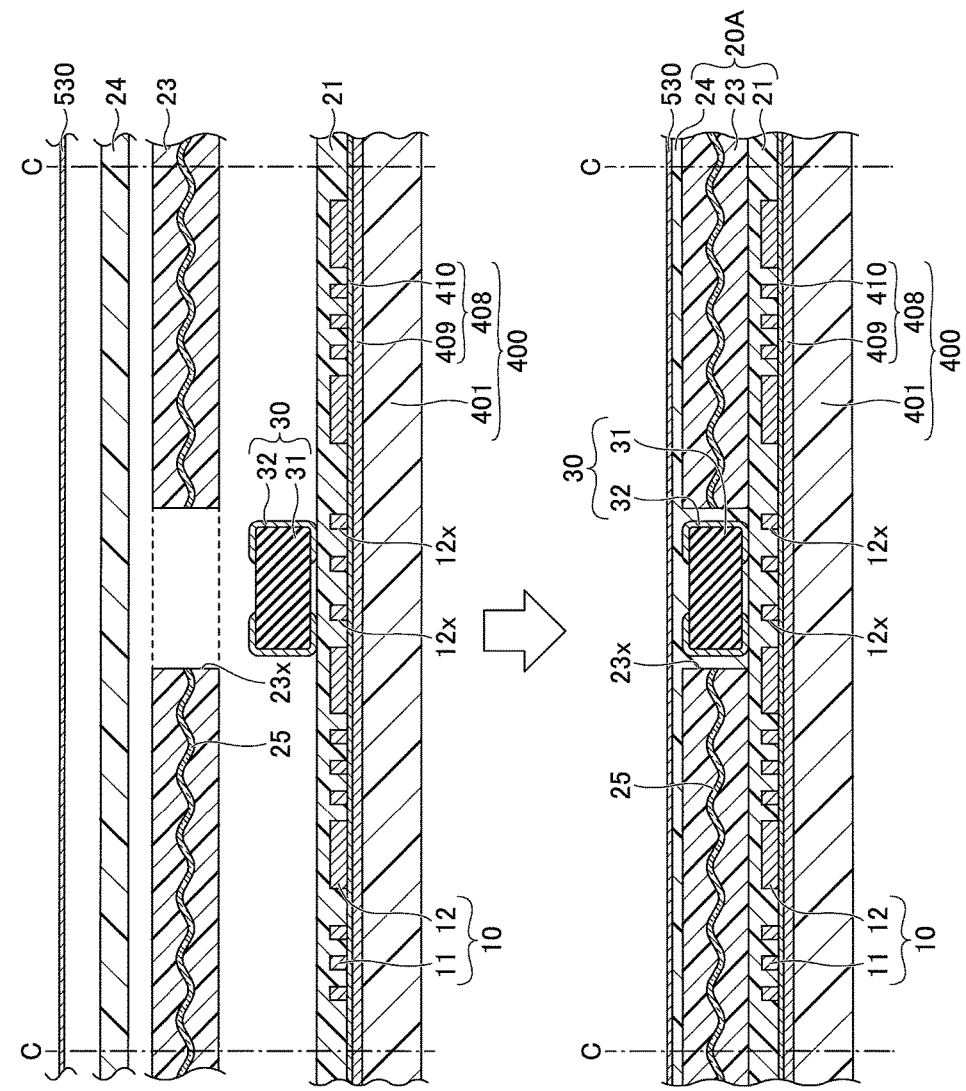
FIG. 9A to FIG. 9C are views illustrating an example of manufacturing steps of the wiring board of the alternative example 2 of the first embodiment.

Specifically, in a step illustrated in FIG. 9A, as illustrated above an arrow, the second insulating film 23 made of film epoxy-based insulating resin or the like, the third insulating film 24 made of film epoxy-based insulating resin or the like, and a thin foil 530 made of a copper foil or the like are prepared. Here, the second insulating film 23 includes the reinforcing member 25 and is provided with the electronic component housing portion 23x that is an opening penetrating the second insulating film 23.

Then, as illustrated below the arrow, the second insulating film 23 is placed on the first insulating film 21 so as to house the electronic component 30 in the electronic component housing portion 23x, and further, the third insulating film 24 and the thin foil 530 are placed on the second insulating film 23 in this order. Then, while pressing the second insulating film 23, the third insulating film 24 and the thin foil 530 toward the support body 400, the second insulating film 23 and the third insulating film 24 are heated to temperature greater than curing temperature to be cured. With this, the insulating layer 20A is formed. Resin of the third insulating film 24 is filled in the electronic component housing portion 23x. The thin foil 530 becomes the first layer 53 after being processed.

Figure 9B:
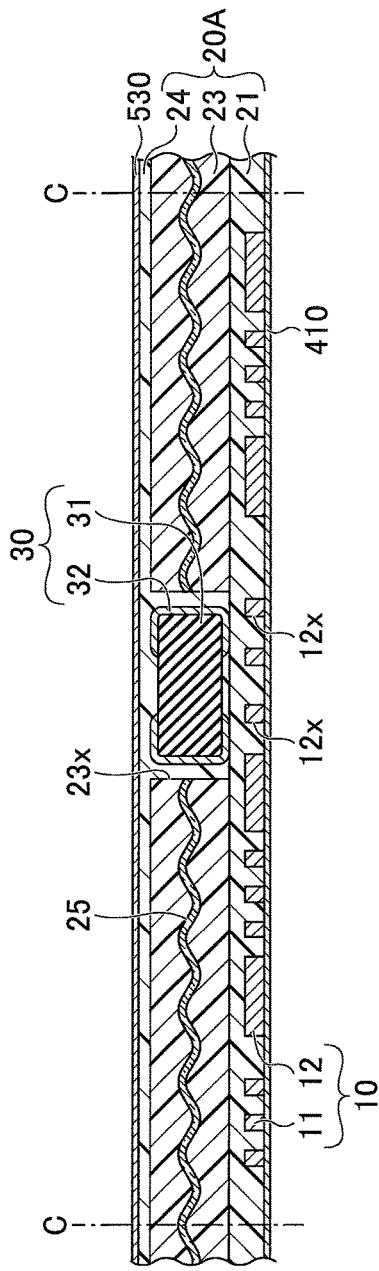

Next, in a step illustrated in FIG. 9B, similar to the step illustrated in FIG. 3C, by applying mechanical force to the support body 400 of the structure body illustrated in FIG. 9A, an interface between the thin foil 410 and the thick foil 409 of the metal foil with the carrier 408 is peeled. With this, only the thin foil 410 remains at the insulating layer 20A, and other members (the prepreg 401 and the thick foil 409) composing the support body 400 are removed.

Figure 9C:
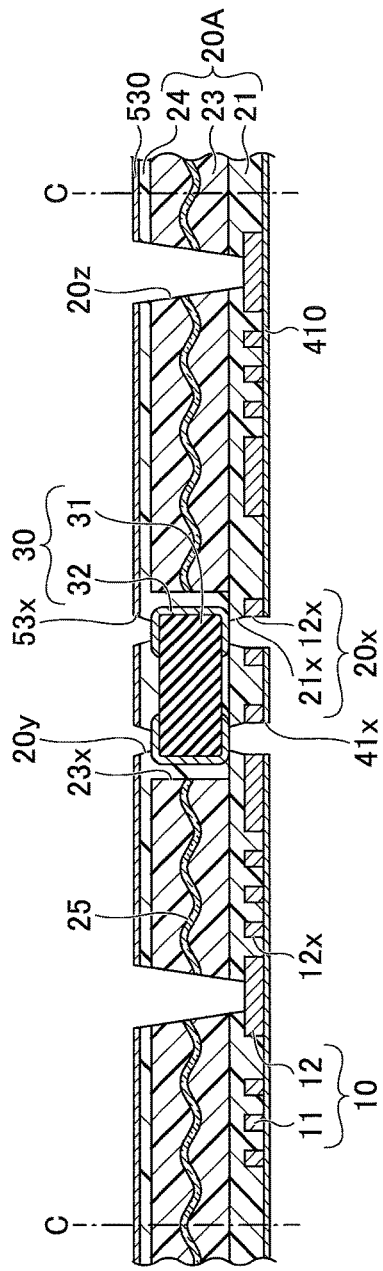

Next, in a step illustrated in FIG. 9C, the through-holes 41x are formed in the thin foil 410. Further, through-holes 53x are formed in the thin foil 530. Further, the via holes 20x, 20y and 20z are formed in the insulating layer 20A. The through-holes 41x and the via holes 20x are formed similarly as the step illustrated in FIG. 3D.

For forming the via holes 20y, laser is irradiated on the third insulating film 24 through the thin foil 530. With this, the through-hole 53x is formed in the thin foil 530, and further, the third insulating film 24 between the thin foil 530 and the electrode 32 of the electronic component 30 is removed to form the via hole 20y that communicates with the through-hole 53x. The electrode 32 of the electronic component 30 is exposed in the via hole 20y.

Similarly, for forming the via hole 20z, laser is irradiated on the second insulating film 23 and the third insulating film 24 through the thin foil 530. With this, the through-hole 53x is formed in the thin foil 530, and further, the second insulating film 23 and the third insulating film 24 between the thin foil 530 and the connection wiring 12 of the first wiring layer 10 are removed to form the via hole 20z that communicates with the through-hole 53x. The connection wiring 12 of the first wiring layer 10 is exposed in the via hole 20z.

Next, steps same as those of FIG. 4A to FIG. 5B are performed. At this time, the first layer 53 and the second layer 54 are patterned by etching using the third layer 55 as a mask, and the third wiring layer 50A is formed. Next, after performing a step similar to that of FIG. 5C, the structure body is cut at cut positions C by a slicer or the like to be individualized, and a plurality of the wiring boards 3 (see FIG. 8) are completed.

As such, the rigidity of the entirety of the wiring board 3 can be increased as the second insulating film 23 includes the reinforcing member 25. Other advantages are the same as those of the first embodiment.

(Applied Example 1 of Wiring Board)

In an applied example 1 of the wiring board, an example of a semiconductor package is described in which a semiconductor chip is mounted (flip-chip mounted) on the wiring board 1 of the first embodiment. In the applied example 1 of the wiring board, for the same components that are already described above, descriptions are sometimes not repeated.

Figure 10:
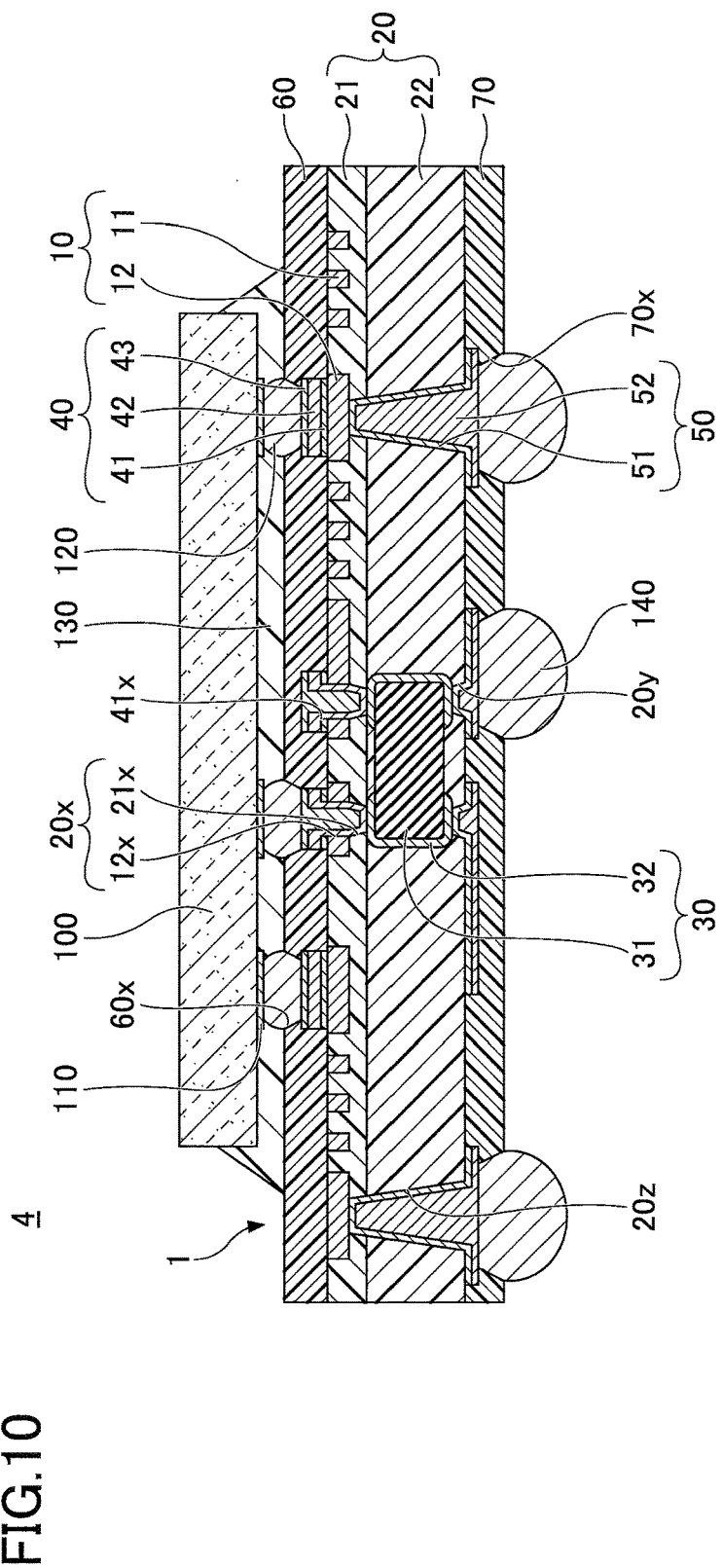
FIG. 10 is a cross-sectional view illustrating an example of a semiconductor package of an applied example 1.

FIG. 10 is a cross-sectional view illustrating an example of a semiconductor package 4 of the applied example 1. With reference to FIG. 10, the semiconductor package 4 includes the wiring board 1 illustrated in FIG. 1A and FIG. 1B, a semiconductor chip 100, bumps 120, underfill resin 130 and terminals for external connection 140. In the semiconductor package 4, a solder resist layer 60 side of the wiring board 1 is a chip mounting surface on which the semiconductor chip 100 is mounted, and a solder resist layer 70 side of the wiring board 1 is an external connection surface on which the terminals for external connection 140 are formed.

The semiconductor chip 100 has a structure, for example, in which a semiconductor integrated circuit (not illustrated in the drawings) or the like is formed on a semiconductor substrate (not illustrated in the drawings) which is a thinned substrate made of silicon or the like. Electrode pads 110 that are electrically connected to the semiconductor integrated circuit (not illustrated in the drawings) are formed on the semiconductor substrate (not illustrated in the drawings).

Each of the bumps 120 electrically connects the respective electrode pad 110 of the semiconductor chip 100 and the second wiring layer 40 exposed in each of the open portions 60x of the solder resist layer 60 of the wiring board 1. The bump 120 is, for example, a solder bump. As the material of the solder bump, for example, an alloy containing Pb, an alloy of Sn and Cu, an alloy of Sn and Ag, an alloy of Sn, Ag and Cu or the like may be used. The underfill resin 130 is filled between the semiconductor chip 100 and the wiring board 1 (insulating layer 20).

The terminal for external connection 140 is formed on the third wiring layer 50 that is exposed in each of the open portions 70x of the solder resist layer 70 of the wiring board 1. The terminal for external connection 140 is, for example, a solder bump. As the material of the solder bump, a material same as that described as the bump 120 may be used.

As such, the semiconductor package 4 can be obtained by mounting the semiconductor chip 100 on the wiring board 1 of the first embodiment. As the heights of the parts of the second wiring layer 40 that expose in the open portions 60x of the solder resist layer 60 are constant in the wiring board 1, gaps between the parts of the second wiring layer 40 and the respective electrode pads 110 of the semiconductor chip 100 become constant in the wiring board 1. Thus, it is possible to easily connect the parts of the second wiring layer 40 and the respective electrode pads 110. Here, the wiring board 2 or the wiring board 3 may be used instead of the wiring board 1.

(Applied Example 2 of Wiring Board)

In an applied example 2 of the wiring board, an example of a semiconductor package is described in which an electronic component 200 is included instead of the electronic component 30 of the applied example 1 of the wiring board. In the applied example 2 of the wiring board, for the same components that are already described above, descriptions are sometimes not repeated.

Figure 11A:
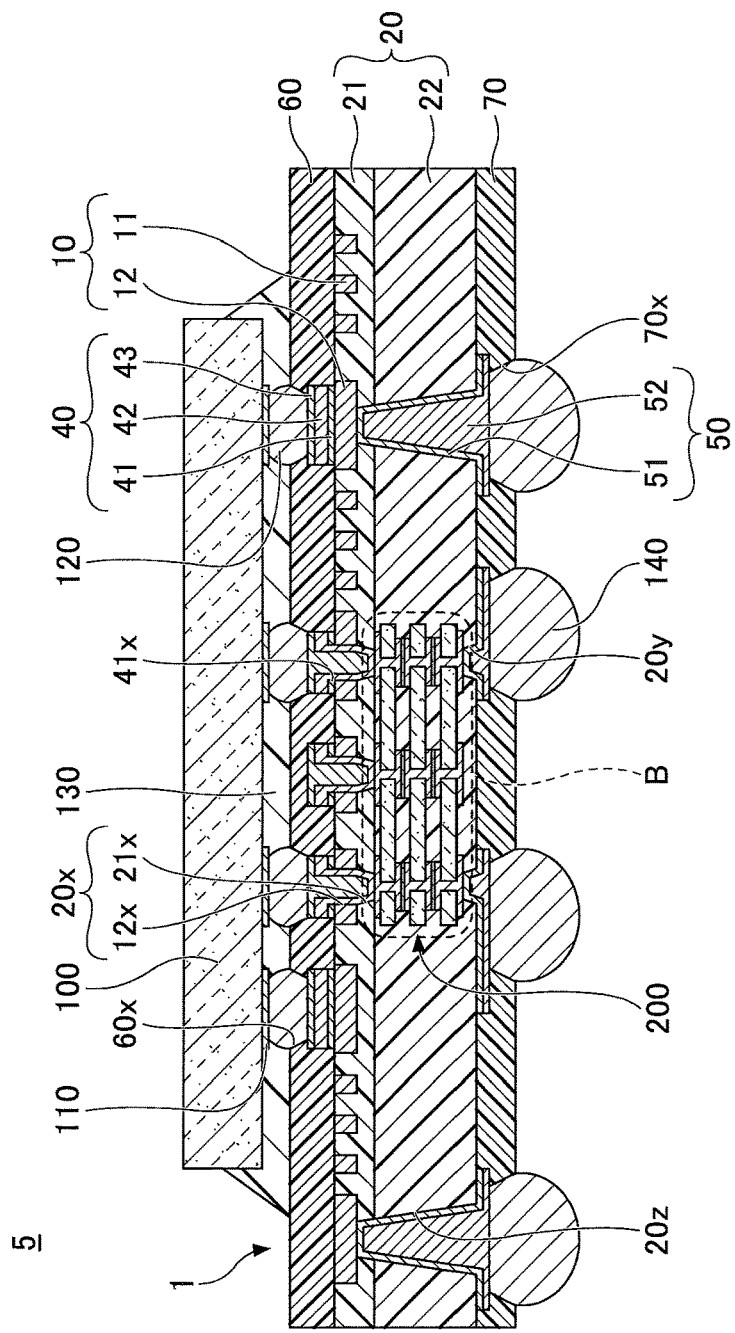
FIG. 11A and FIG. 11B are cross-sectional views illustrating an example of a semiconductor package of an applied example 2.
Figure 11B:
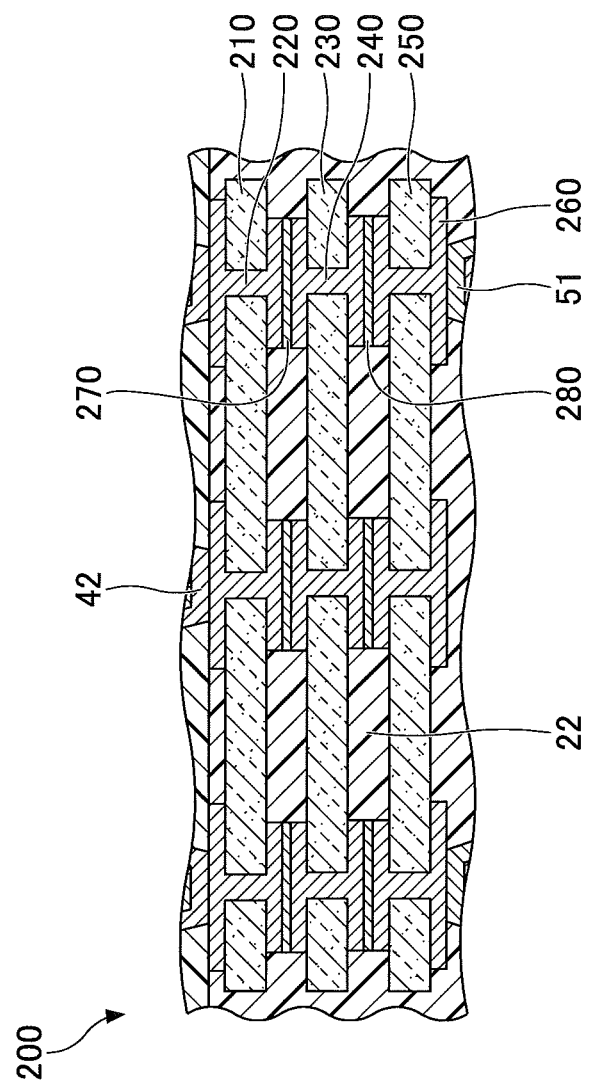

FIG. 11A and FIG. 11B are cross-sectional views illustrating a semiconductor package 5 of the applied example 2. FIG. 11A is a view illustrating the entirety of the semiconductor package 5, and FIG. 11B is an enlarged cross-sectional view of FIG. 11A around a portion "B". With reference to FIG. 11A and FIG. 11B, the semiconductor package 5 is different from the semiconductor package 4 (see FIG. 10) in that the electronic component 30 is substituted by the electronic component 200.

The electronic component 200 is a stacked body in which semiconductor chips 210, 230 and 250 are stacked. The semiconductor chips 210, 230 and 250 are, for example, memory chips.

Through electrodes 220 each penetrates the semiconductor chip 210 to protrude at both surfaces of the semiconductor chip 210 are formed at the semiconductor chip 210. Similarly, through electrodes 240 each penetrates the semiconductor chip 230 to protrude at both surfaces of the semiconductor chip 230 are formed at the semiconductor chip 230. Through electrodes 260 each penetrates the semiconductor chip 250 to protrude at both surfaces of the semiconductor chip 250 are formed at the semiconductor chip 250.

A portion of each of the through electrodes 220 that protrudes at a lower surface of the semiconductor chip 210 and a portion of each of the through electrodes 240 that protrudes at an upper surface of the semiconductor chip 230 are bonded through a bonding portion 270 such as solder. Further, a portion of each of the through electrodes 240 that protrudes at a lower surface of the semiconductor chip 230 and a portion of each of the through electrodes 260 that protrudes at an upper surface of the semiconductor chip 250 are bonded through a bonding portion 280 such as solder.

A portion of each of the through electrodes 220 that protrudes at an upper surface of the semiconductor chip 210 is directly connected to the second layer 42 that composes the via wiring of the second wiring layer 40. Further, a portion of each of the through electrodes 260 that protrudes at a lower surface of the semiconductor chip 250 is directly connected to the first layer 51 that composes the via wiring of the third wiring layer 50.

As such, the wiring board 1 or the like may include a stacked body of semiconductor chips as the electronic component. At this time, the number of sacked semiconductor chips may be two, four or more. In such a case, the semiconductor chips may have the same function, or may have different functions. Further, instead of the stacked body of the semiconductor chips, a single semiconductor chip may be included as the electronic component.

According to the embodiment, a wiring board is provided in which connection reliability between an embedded wiring and an electrode of an electronic component is improved.

Although a preferred embodiment of the wiring board has been specifically illustrated and described, it is to be understood that minor modifications may be made therein without departing from the spirit and scope of the invention as defined by the claims.

The present invention is not limited to the specifically disclosed embodiments, and numerous variations and modifications may be made without departing from the spirit and scope of the present invention.

For example, as a method of manufacturing the wiring board 1 or the like, metal foils with the carrier 408 may be stacked on both surfaces of the prepreg 401 to form a support body, and components that become the wiring boards may be formed on both surfaces of the support body. Thereafter, unnecessary parts of the support body may be removed.

Various aspects of the subject-matter described herein are set out non-exhaustively in the following numbered clauses:

1. A method of manufacturing a wiring board including:

preparing a support body including a metal foil as an outermost layer, and forming a first wiring layer on the metal foil;

forming a first insulating film on the metal foil that covers the first wiring layer;

mounting an electronic component on the first insulating film;

forming a second insulating film that covers the electronic component on the first insulating film;

removing the support body except the metal foil;

forming a via hole that penetrates the metal foil and the first insulating film and exposes an electrode of the electronic component; and after forming a metal layer on the metal foil and in the via hole, patterning the metal foil and the metal layer to form a second wiring layer that includes a wiring pattern including the metal foil and the metal layer, and a via wiring that is extended from the wiring pattern to be extended in the via hole and directly connected to the electrode of the electronic component.

2. The method of manufacturing the wiring board according to clause 1, wherein the forming the second wiring layer includes forming a seed layer that continuously covers the entirety of the metal foil, an inner wall surface of the via hole, and the electrode of the electronic component that is exposed in the via hole, forming an electrolytic plating layer selectively on the seed layer by electrolytic plating using the seed layer as a power supply layer, and removing the seed layer and the metal foil that are not covered by the electrolytic plating layer by etching.

3. The method of manufacturing the wiring board according to clause 1, wherein in the forming the first wiring layer, a through-hole is formed at a region of the first wiring layer where the electrode of the electronic component is to be formed, and wherein in the forming the via hole, irradiating laser on the metal foil and the first insulating film at a position corresponding to the through-hole to form the via hole that exposes the electrode of the electronic component.

What is claimed is:

1. A wiring board comprising:
an electronic component;
an insulating layer containing the electronic component therein, and including a via hole that is open at one surface of the insulating layer to expose an electrode of the electronic component;
a first wiring layer embedded in the insulating layer, one surface of the first wiring layer being exposed at the one surface of the insulating layer;
a second wiring layer including
a first layer directly formed on the one surface of the first wiring layer and including a through-hole that communicates with the via hole,
a second layer formed on the first layer to be extended from above the first layer to be formed along inner walls of the through-hole and the via hole, and further covering one surface of the electrode of the electronic component that is exposed in the via hole, and
a third layer formed on the second layer to be extended from above the second layer to fill the through-hole and the via hole in which the second layer is formed,
wherein the first layer, a part of the second layer formed on the first layer, and a part of the third layer formed on the second layer form a wiring pattern formed on the one surface of the first wiring layer, and
wherein another part of the second layer formed in the through-hole and the via hole, and another part of the third layer formed in the through-hole and the via hole form a via wiring extended from the wiring pattern to be extended in the via hole and directly connected to the electrode of the electronic component.

2. The wiring board according to claim 1,
wherein the first wiring layer is formed to be positioned above the electrode of the electronic component, and
wherein the via hole is formed to penetrate the first wiring layer that is positioned above the electrode of the electronic component, and penetrate the insulating layer positioned between the first wiring layer and the electrode of the electronic component.

3. The wiring board according to claim 1, further comprising:
a solder resist layer formed on the one surface of the insulating layer, covering the wiring pattern of the second wiring layer, and including an open portion that selectively exposes the wiring pattern, and
wherein the wiring pattern that is exposed in the open portion is a semiconductor chip connection pad.

4. The wiring board according to claim 1,
wherein the wiring pattern of the second wiring layer includes a wiring connected to the via wiring, and a wiring that is not connected to the via wiring, and
wherein the wiring connected to the via wiring, and the wiring that is not connected to the via wiring have the same height.

5. The wiring board according to claim 1,
wherein the insulating layer includes a second via hole that is open at another surface of the insulating layer to expose an electrode of the electronic component,
the wiring board further comprising:
a third wiring layer including
a wiring pattern formed on the other surface of the insulating layer, and
a via wiring extended from the wiring pattern to be extended in the second via hole and directly connected to the electrode of the electronic component.

6. The wiring board according to claim 1, wherein the insulating layer has a structure in which a first insulating film that embeds the first wiring layer, and a second insulating film that contains the electronic component therein are stacked.

* * * * *